United States Patent [19]

Inagaki et al.

[11] Patent Number: 5,951,759
[45] Date of Patent: Sep. 14, 1999

[54] APPARATUS OF PULLING UP SINGLE CRYSTALS

[75] Inventors: Hiroshi Inagaki; Fumitaka Ishikawa, both of Kanagawa, Japan

[73] Assignee: Komatsu Electronic Metals Co., Ltd., Kanagawa, Japan

[21] Appl. No.: 08/950,435

[22] Filed: Oct. 15, 1997

[30] Foreign Application Priority Data

Oct. 15, 1996 [JP] Japan .................................. 8-294412

[51] Int. Cl.$^6$ ................................................ C30B 35/00
[52] U.S. Cl. ........................ 117/218; 117/208; 117/911
[58] Field of Search ............................. 117/14, 15, 200, 117/208, 218, 900, 911

[56] References Cited

U.S. PATENT DOCUMENTS

| | | | |
|---|---|---|---|
| 4,190,630 | 2/1980 | Apilat et al. | 117/911 |
| 5,126,113 | 6/1992 | Yamagishi et al. | 117/900 |
| 5,156,822 | 10/1992 | Whipple, III | 117/911 |
| 5,173,270 | 12/1992 | Kida et al. | 117/911 |

Primary Examiner—Felisa Hiteschew
Attorney, Agent, or Firm—Sughrue, Mion, Zinn, Macpeak & Seas, PLLC

[57] ABSTRACT

This invention provides a apparatus and a method of pulling up single crystals, which respond to the weight increase of semiconductor single crystal produced by the CZ method. The retaining wire wind-up mechanisms 11, 12; multiple pairs of guide pipes 4a, 4c capable of being moved upward or downward with respect to the seed holder 1; and a plurality of retaining wires 13, 15, each retaining wire passing through one pair of the guide pipes and having its central portion to be bent into a "U" shape are provided in the central portion of the lifting wire 5. The single crystal 17 can be retained by the retaining wire 13, 15, if the guide pipes 4a, 4c are driven to move downward and the "U" shaped portions of the retaining wires 13, 15 are driven to engage with the necked portion 17b so as to lift single crystal 17. The load is determined based on the detected value coming from the weight sensors installed on the means for winding up the retaining wires. Furthermore, when the single crystal 17 has to be re-melted, the retaining wires 13, 15 is loosened and disengaged with the necked portion 17b.

6 Claims, 5 Drawing Sheets

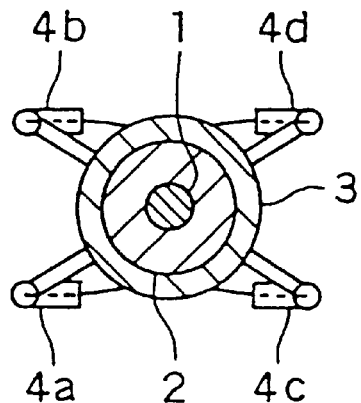
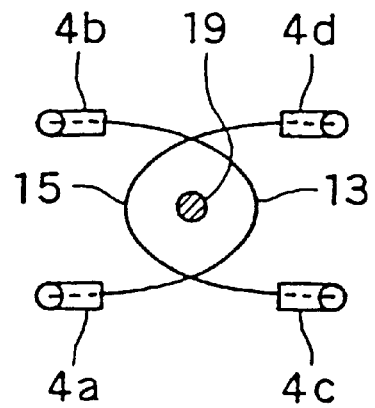
Fig. 2a  Fig. 2b
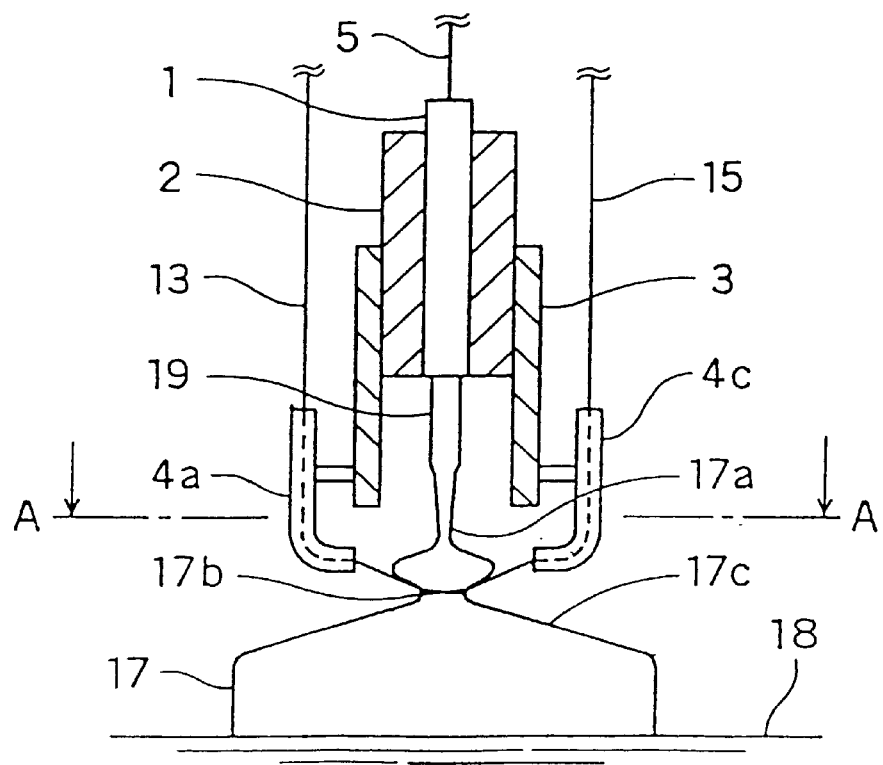
Fig. 3

APPARATUS OF PULLING UP SINGLE CRYSTALS

BACKGROUND OF THE INVENTION

1. Field of the Invention

This invention relates to a apparatus and a method for pulling up single crystals, which apparatus is suitable for installing on an semiconductor single-crystal manufacturing equipment utilizing the CZ method, especially suitable for the process of pulling up heavy single crystals.

2. Description of the Related Art

Conventionally, single crystal silicon is produced by the CZ method. In the CZ method, polycrystalline silicon is deposited into a quartz crucible of a single-crystal manufacturing equipment, then the polycrystalline silicon is heated to melt by way of heaters disposed around the quartz crucible, subsequently a seed crystal installed within a seed holder is dipped into the melted liquid. Subsequently, the seed holder and the quartz crucible are respectively driven to rotate in the same or reversed directions. At the same time, the seed holder is lifted to grow a single crystal with predetermined diameter and length.

In the seed crystal, dislocation will arise due to the heat shock occurring at the time of dipping it into melted liquid. In order to stop propagation of dislocation from the seed crystal to single crystal to be grown, a necked portion with diameter from 1 to 4 mm is grown up beneath the seed crystal so as to release the dislocation to the surface of the necked portion. Making certain that the grown crystal grow dislocation-free state, a shoulder is formed and the single crystal is enlarged to comply with a predetermined diameter. Then, the operation of forming the body of the single crystal is performed.

In recent years, following the enlargement of single crystals, the weight of an individual single crystal is increasing, and the strength extent of the necked portion is reaching its limit. To solve the problem, a necked portion with a diameter larger than that of the necked portion is formed on the top of the shoulder when the propagation of dislocation has been stopped by way of the reduction process. It is possible to hold the single crystal by the necked portion so as to prevent breaking of the necked portion. Alternatively, measures are taken to prevent dropping of the single crystal even if the necked portion breaks. For example, in the single-crystal pulling up apparatus disclosed in Japanese Patent Publication Gazette TOKU KOU HEI 5-65477, a clamp arm capable of being driven to open or close is engaged with the necked portion of a single crystal so as to suspend the single crystal. Furthermore, in the single-crystal pulling up apparatus disclosed in Japanese Patent Publication Gazette TOKU KOU HEI 7-515, a plurality of claws retained at a predetermined angle are provided at the lower end of an engaging holder capable of being driven to ascend or descend. The claws are engaged with the necked portion of a single crystal so as to suspend the single crystal In addition, in the single-crystal pulling up apparatus disclosed in Japanese Patent Publication Gazette TOKU KOU HEI 7-103000, a plurality of claws engaging with the necked portion of a single crystal are provided. The single crystal is suspended by utilizing a plurality of holding levers capable of being driven to open or to close by their ascending or descending movement and a ring used for preventing opening of the holding levers.

However, in the single-crystal pulling up apparatus disclosed in Japanese Patent Publication Gazette TOKU KOU HEI 5-65477, the clamp arm will be driven to open when the weight of the single crystal is getting increased, and there exists a danger of dropping of the single crystal during pulling up operation. However, in the single-crystal pulling up apparatus disclosed in Japanese Patent Publication Gazette TOKU KOU HEI 7-515 and TOKU KOU HEI 7-103000, there exists a danger that the single crystal being pulled up may convert into a polycrystal. That is due to the mechanic shock or vibration induced in the process of clamping the single crystal. In addition, the single crystal and the claws are kept in contact at several points. Therefore there exists a danger that the single crystal may be wrecked. Besides, it is impossible to take the single crystal off from the clamping means, once the single crystal has been clamped and installed in the main chamber. Thus, even if polycrystallization of the single crystal being pulled up has arisen, it is impossible to remelt the single crystal.

SUMMARY OF THE INVENTION

In view of the above disadvantages, the object of the present invention is to provide an apparatus and a method for pulling up single crystals, which are in response to the weight increase of semiconductor single crystal produced by the CZ method. According to this invention, other than conventional necked portions, the clamping means, specifically, the necked portion formed beneath the necked portion can be held and the single crystal under pulling up can be re-melted.

To achieve the above object, the single-crystal pulling up apparatus according to this invention comprises: multiple pairs of guide pipes installed in the apparatus of manufacturing semiconductor single crystal by the CZ method and capable of being moved upward or downward with respect to the seed holder suspended at the lower end of a lifting wire; a plurality of retaining wires, each retaining wire passing through one pair of the guide pipes and having its central portion to be bent into a "U" shape or a ring shape; and means for winding up the retaining wires.

According to the above-described structure, the central portion of each retaining wire is bent into a "U" shape due to that the two ends of each retaining wire are respectively passing through each of one pair of guide pipes. Therefore, it is easy to engage the retaining wires at the necked portion of a single crystal. Furthermore, by winding up the retaining wires, the retaining wires can tightly wrap around the necked portion to hold the single crystal.

One feature of the above-described single-crystal pulling up apparatus is that the retaining wires are made of Tungsten, Molybdenum, or Carbon.

Because the single-crystal pulling up apparatus according to this invention has to be rotated together with the single crystal, it has to be installed within the main chamber of the single-crystal manufacturing equipment. Thus, it is necessary to keep the single crystal and the single-crystal manufacturing equipment away from being contaminated by the retaining wires. Furthermore, the retaining wires should have good heat resistivity. Retaining wires made of Tungsten, Molybdenum, or Carbon can meet the above requirement.

Another feature of the single-crystal pulling up apparatus according to this invention is that weight sensors are respectively provided on the means for winding up the lifting wires and the retaining wires.

The total weight of the single crystal being pulled up and the means for winding up the retaining wires can be detected by the weight sensors disposed on the means for winding up the lifting wires, and the weight of the single crystal can be calculated from the detected value. On the occasion using weight-type diameter control method, the diameter of the single crystal can be controlled based on the above calculated weight value. The load exerted on the retaining wires can be calculated from the detected value of the weight sensors disposed on the means for winding up the retaining wires, therefore the load exerted on each retaining wire can be adjusted as required.

Furthermore, another feature of the single-crystal pulling up apparatus according to this invention is that each of the multiple pairs of the guide pipes can be driven to move upward or downward independently.

When the seed crystal is dipped into melted liquid, the "U" shaped portion of the retaining wire will approach the free surface of melted liquid. However, by moving each guide pipe independently, by which the retaining wires are retained, upward or downward, elevation of the "U" shaped portion of the retaining wire can be adjusted based on its hanging state. In this manner, contact between the retaining wire and melted liquid can be avoided.

Furthermore, another feature of the single-crystal pulling up apparatus according to this invention is that: steps in the process of manufacturing semiconductor single crystals by the CZ method are, first, forming a necked portion above the shoulder of the single crystal, then engaging the "U" or ring shaped portions of the retaining wires with the necked portion, and thereafter winding up the retaining wires to hold the single crystal.

In this manner, it is possible to hold the single crystal firmly by winding flexible retaining wires around the necked portion instead of using conventional claws or clamp arms which keep in touch with the necked portion only by small portions. In addition, if the winding-up means is driven to rotate in release direction, the retaining wires can be released from the necked portion. Therefore, re-melting of the single crystal being pulled up is made easy.

Furthermore, another feature of the single-crystal pulling up apparatus according to this invention is that the operations of the means for winding up the lifting wires and the means for the retaining wires are controlled independently.

The winding up of the lifting wires and the retaining wires are performed independently, therefore it is possible to adjust the load of each retaining wire in an arbitrary manner.

BRIEF DESCRIPTION OF THE DRAWINGS

The present invention can be more fully understood from the subsequent detailed description and examples with reference to the accompanying drawings, wherein:

FIGS. 2(a) and 2(b) are cross sectional views respectively showing the structure of the single-crystal pulling up apparatus shown in FIG. 1, wherein FIG. 2(a) is a cross sectional view along line A—A of FIG. 1, and FIG. 2(b) is a cross sectional view along line B—B of FIG. 1;

FIG. 3 is a schematic cross sectional view showing the status where a single crystal is hold by retaining wires;

DETAILED DESCRIPTION OF THE PREFERRED EMBODIMENT

The embodiments of the single-crystal pulling up apparatus according to this invention are described hereinafter with reference to the drawings.

Figure 1:
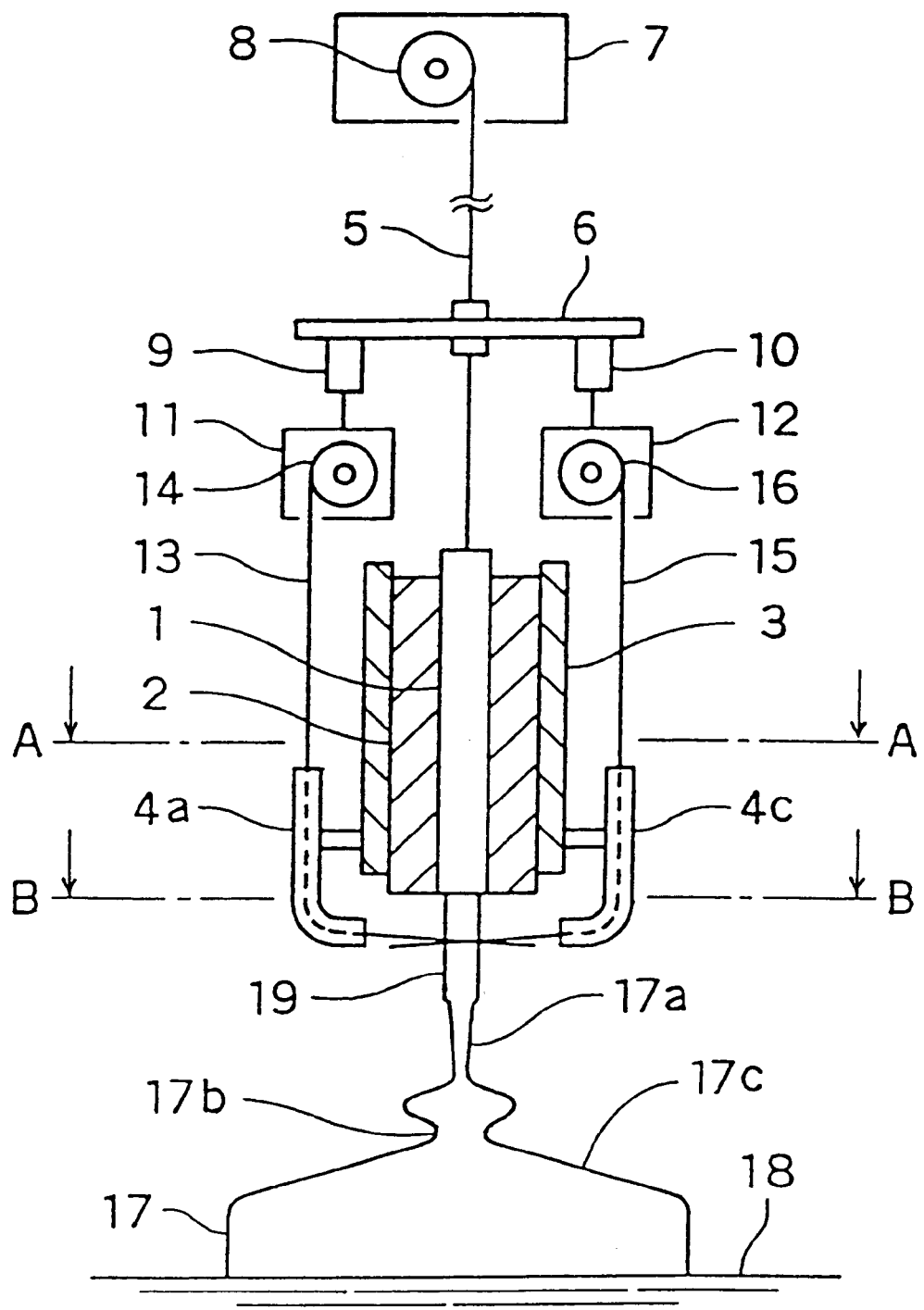
FIG. 1 is a schematic cross sectional view showing an outline structure of the first embodiment of the single crystal pulling up apparatus according to this invention.

FIG. 1 is a schematic cross sectional view showing an outline structure of the first embodiment of the single-crystal pulling up apparatus according to this invention. FIG. 2(a) is a cross sectional view along line A—A of FIG. 1, and FIG. 2(b) is a cross sectional view along line B—B of FIG. 1. As shown in FIGS. 1, 2(a), and 2(b), that a cylindrical guide boss 2 is affixed on the outer peripheral surface of a seed holder 1, a guide pipe support cylinder 3 is fitted on the outer peripheral surface of the guide boss 2. The guide pipe support cylinder 3 can be driven to move upward or downward along the outer peripheral surface of the guide boss 2 by a solenoid (not shown). The "L" shaped guide pipes 4a, 4b, 4c, and 4d are affixed on the lower end of the guide pipe support cylinder 3.

A lifting wire 5 affixed to the seed holder 1 is extending upward and passes through an installation equipment 6 which is used for installing retaining mechanisms. The upper end of the lifting wire 5 is winding around the wind-up drum 8 of a crystal pulling up mechanism 7 installed on the upper portion of a apparatus for manufacturing semiconductor single crystal. The crystal pulling up mechanism 7 is provided with a weight sensor (not shown) for detecting the total weight suspended at the lifting wire 5. In addition, retaining wire wind-up mechanisms 11 and 12 are suspended at the installation equipment 6 by way of the weight sensors 9, 10.

One end of the retaining wire 13 is secured at the retaining wire wind-up mechanism 11. The other end of the retaining wire 13 passes through a guide pipe 4a and then turns a "U" curve to pass through a guide pipe 4b, at last it winds around the wind-up drum 14 of the retaining wire wind-up mechanism 11. Similarly, one end of the retaining wire 15 is secured at the retaining wire wind-up mechanism 12. The other end of the retaining wire 15 passes through a guide pipe 4c and then turns a "U" curve to pass through a guide pipe 4d, at last it winds around the wind-up drum 16 of the retaining wire wind-up mechanism 12. The installation equipment 6 rotates and moves upward or downward together with the lifting wire 5. In addition, retaining wires 13, 15 are made of Tungsten, Molybdenum, or Carbon.

The signals detected by the weight sensors 9, 10 installed in the installation equipment 6 and the weight sensor installed in the crystal pulling up mechanism 7 are inputted into a control apparatus (not shown) disposed outside of the semiconductor single-crystal manufacturing apparatus. Thus, the weight of the single crystal being pulled up can be measured.

The following is a description of pulling up method, in which a single-crystal pulling up apparatus according to this embodiment is utilized.

Before pulling up the single crystal 17, the guide pipe support cylinder 3 is moved to its uppermost location. Then, the retaining wire wind-up mechanisms 11, 12 are driven to wind up the retaining wires 13, 15 so as to tighten the retaining wires 13, 15 located between the retaining wire wind-up mechanisms 11, 12 and the guide pipes 4a, 4b, 4c, and 4d. Then, the wind-up drum 8 of the crystal pulling up mechanism 7 is driven to rotate in the release direction to lower the seed holder 1, and the seed crystal 19 is dipped into the melted liquid 18 and merges with the melted liquid 18. Afterwards, the seed holder 1 is driven to rotate and ascend to from a necked portion 17a with a diameter less than that of the seed crystal 19. Then, after ensuring that the single crystal grows to a dislocation-free state by stopping the propagation of dislocation, the pulling up speed is slowed down to enlarge the diameter of the single crystal. Subsequently, the pulling up speed is accelerated to reduce the diameter of the single crystal so as to form a necked portion 17b. Then, in a shoulder forming process, diameter of the single crystal is enlarged to a predetermined value and in a body forming process, the operation of forming the body of the single crystal is performed.

Figure 4:
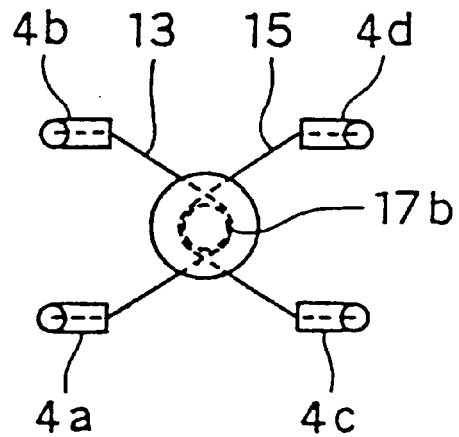
FIG. 4 is a cross sectional view along line A—A of FIG. 3.

After the shoulder forming process has proceeded to a certain extent, the guide pipe support cylinder 3 is lowered to its lowermost location and the retaining wire wind-up mechanisms 11, 12 are driven to rotate in the release direction. After lowering the lower ends of the guide pipes 4a, 4b, 4c, 4d to a location somewhat higher than the necked portion 17b, the "U" shaped portion of the retaining wires 13, 15 will touch the shoulder 17c of the single crystal 17. Then, the retaining wire wind-up mechanisms 11, 12 are driven to rotate in the wind-up direction, and the "U" shaped portion of the retaining wires 13, 15 will contract and wind around the necked portion 17b (see FIGS. 3 and 4) to hold the necked portion 17b. on this occasion, the wind-up speed of the retaining wires 13, 15 is controlled to keep any mechanical shock away from the necked portion 17b.

During pulling up of the single crystal 17, the retaining wire wind-up mechanisms 11, 12 are controlled to keep the retaining wires 13, 15 under preset loads. A control apparatus (not shown) performs the above control basing on detected signals coming from the weight sensor installed on the crystal pulling up mechanism 7 and the weight sensors 9, 10 installed on the installation equipment 6.

During pulling up of the single crystal 17, the retaining wires 13, 15 may be arranged to share none of the weight of the single crystal 17 and only to retain the single crystal 17 at the necked portion 17a. Accordingly, the retaining wires 13, 15 can be used as a drop prevention apparatus when the necked portion 17a breaks. At that moment, torque is continuously applied on the motors of the retaining wire wind-up mechanisms 11, 12 or motors with brakes are used in of the retaining wire wind-up mechanisms 11, 12 to prevent sagging of the retaining wires 13, 15.

Due to the fact that each of the retaining wires 13, 15 winds on the necked portion 17b of the single crystal 17 for about half of its periphery, the total periphery of the necked portion 17b is substantially surrounded. Thus, the danger of breaking the necked portion 17b by stress concentration is eliminated. Furthermore, even if the diameter of the necked portion 17b alters, the same retaining wires can also be used without any hindrance. Furthermore, when the shape of the necked portion 17b formed is unsymmetrical to its axis, it is possible to retain the necked portion 17b in an unbiased way by controlling the wind-up quantities of the retaining wires 13, 15.

Figure 5:
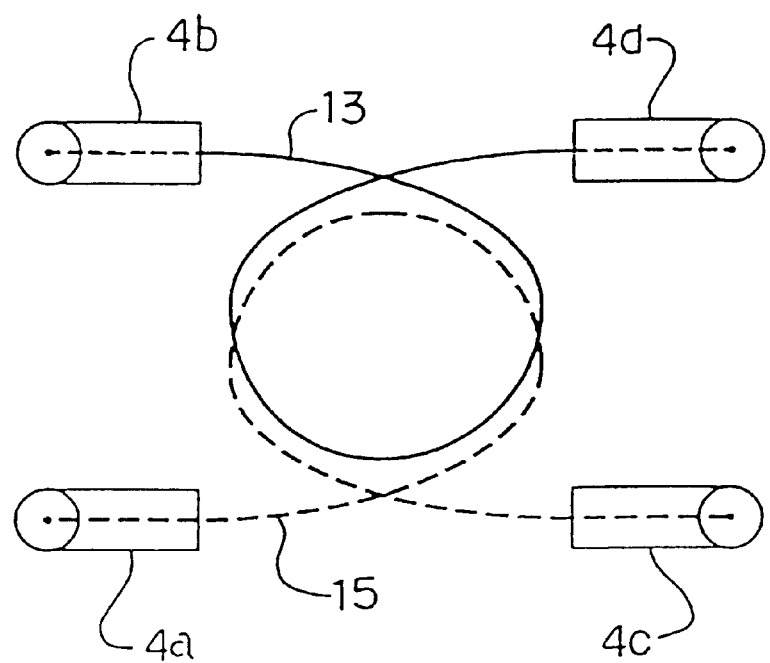
FIG. 5 is a top view showing another status where a single crystal is retained by two retaining wires.
Figure 6:
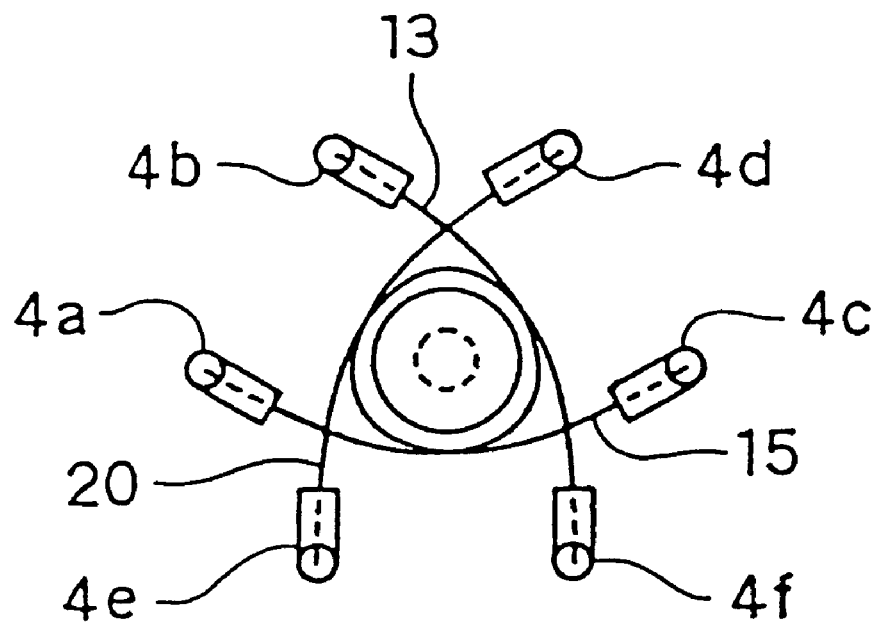
FIG. 6 is a top view showing a status where a single crystal is retained by three retaining wires.

Other methods of winding the retaining wires 13, 15 around the necked portion 17b are respectively shown in FIGS. 5 and 6. FIG. 5 shows a method, in which two retaining wires 13, 15 are respectively coiled like a ring and winds around the necked portion 17b for one circle. On this occasion, one retaining wire 13 (solid line) retains the necked portion 17b between the guide pipe 4b and the guide pipe 4d. Another retaining wire 13 (dotted line) retains the necked portion 17b between the guide pipe 4a and the guide pipe 4c. By this one-circle winding, the necked portion 17b can be a retained firmly. FIG. 6 shows a situation where three sets of guide pipes 4a, 4b, 4c, 4d, 4e, 4f and three retaining wires 13, 15, 20 are used. As shown in FIG. 6, three retaining wires 13, 15, 20 are respectively coiled like a ring and wind on the necked portion 17b for one circle. The first retaining wire 13 is coiled between the guide pipe 4b and the guide pipe 4f, and winds on the necked portion 17b for one circle to retain it. The second retaining wire 15 is coiled between the guide pipe 4a and the guide pipe 4c, and winds on the necked portion 17b for one circle to retain it. The third retaining wire 20 is coiled between the guide pipe 4d and the guide pipe 4e, and winds on the necked portion 17b for one circle to retain it. Although not shown in the figures, it goes well if the necked portion 17b is clamped by the three retaining wires 13, 15, 20. Specifically, the necked portion 17b is engaged with and clamped by the first retaining wire 13 extending between the guide pipe 4b and the guide pipe 4f, the second retaining wire 15 extending between the guide pipe 4a and the guide pipe 4c, and the third retaining wire 20 extending between the guide pipe 4d and the guide pipe 4e, respectively.

Figure 7:
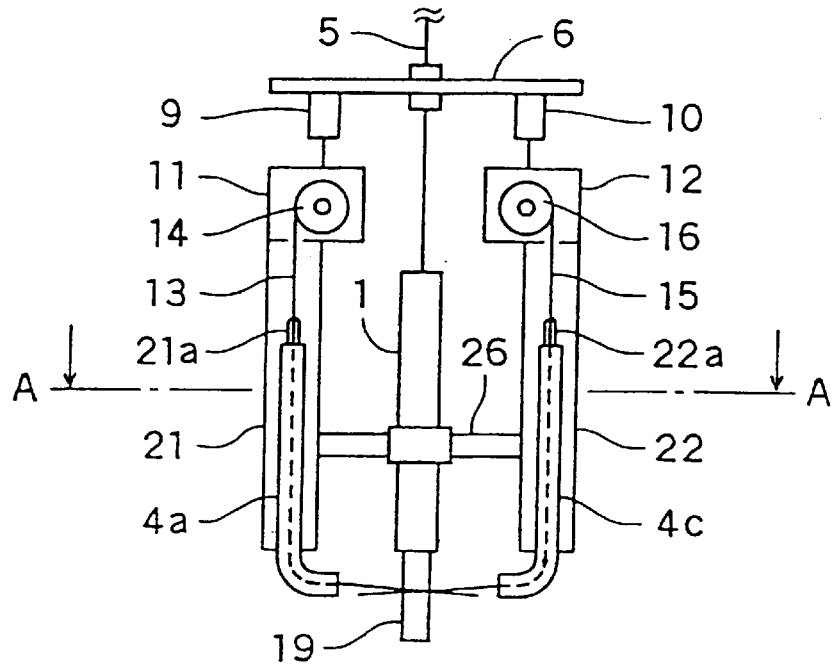
FIG. 7 is a schematic side view showing an outline structure of the second embodiment of the single-crystal pulling up apparatus according to this invention.
Figure 8:
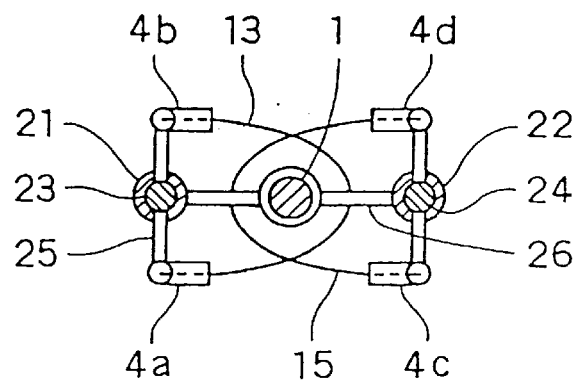
FIG. 8 is a cross sectional view along line A—A of FIG. 7.

FIG. 7 is a schematic side view showing an outline structure of the second embodiment of the single-crystal pulling up apparatus according to this invention. FIG. 8 is a cross sectional view along line A—A of FIG. 7. As shown in FIGS. 7 and 8, two guide pipe support cylinders 21, 22 are installed underneath the retaining wire wind-up mechanisms 11, 12. Furthermore, two guide pipe support axes 23, 24 are inserted within the guide pipe support cylinders 21, 22, and the guide pipe support axes 23, 24 are driven to move upward or downward by solenoids (not shown). Two sets of guide pipes 4a, 4b and 4c, 4d are affixed to the guide pipe support axes 23, 24 by way of a support arm 25. Each set of the guide pipes 4a, 4b and 4c, 4d is driven to move upward or downward independently by the upward or downward movement of the support arm 25 along the guide slots 21a, 22a respectively formed in the guide pipe support cylinders 21, 22. To eliminate the vibration occurring in the guide pipe support cylinders 21, 22 at the time when the guide pipe support axes 23, 24 move upward or downward or the retaining wires 13, 15 clamp the necked portion of the single crystal, the guide pipe support cylinders 21, 22 are connected to the seed holder 1 by way of a support arm 26.

Before retaining the necked portion 17b of the single crystal 17, the "U" shaped portion of the retaining wires 13, 15 are sagging freely, however, it is not a restriction that the extent of sagging should be the same. Therefore, as shown in the second embodiment, on the occasion that two sets of guide pipes can be driven to move upward or downward independently, the height of the guide pipes can be adjusted based on the extent of sagging of the retaining wires 13, 15. Even in the case of dipping the seed crystal into melted liquid, no hindrance will be incurred.

Due to some reasons, it often happens that dislocation or polycrystallization occurs at the beginning of body forming process, and that the pulling up operation of the single crystal 17 (see FIG. 3) has to be stopped to re-melt the solidified portion. On this occasion, the solidified portion is dipped into the melted liquid 18, then the retaining wire wind-up mechanism are driven to rotate in the release direction to loosen the retaining wires 13, 15 which are winding around the necked portion 17b. The retaining wires 13, 15 will leave the necked portion 17b with the aid of their tension forces and thus release the single crystal 17. Afterwards, the solenoids are driven to move the guide pipe support cylinder 3 upward, and the single crystal 17 can be re-melted until the necked portion 17a. Then, the seed crystal 19 is dipped into the melted liquid again to form the necked portion 17a and the necked portion 17b. Then, the retaining wires 13, 15 are engaged with the necked portion 17b to lift the single crystal 17.

In the first and the second embodiments, the descriptions concern about the method and the apparatus for pulling up single crystals, which apparatus is installed on a wire type semiconductor single-crystal manufacturing equipment. However, this invention is also suitable for a shaft type semiconductor single-crystal manufacturing equipment. In particular, on the occasion that the apparatus of this invention is installed on a force bar type semiconductor single-crystal manufacturing equipment, when the retaining wires touch the necked portion of the single crystal, the vibration or shock induced in the single crystal will be more easily lessened than those in a wire type semiconductor single-crystal manufacturing equipment. Thus, a satisfactory outcome can be obtained.

According to this invention, a plurality of retaining wires are used to wind around the necked portion formed beneath the necked portion of a single crystal being pulled up by the CZ method, therefore the single crystal can be retained and pulled up firmly in disregard of altering of the diameter or the shape of the necked portion. Due to the fact that flexible wires are used as retaining means, the shock occurred at the time of engaging the single crystal is very slight and the portion being retained is intense. Therefore, differing from conventional retaining means in that there is no danger of breaking the necked portion or dropping the single crystal. Furthermore, even if dislocation or polycrystallization has occurred in the single crystal 17 being pulled up, the retaining wires can be easily disengaged with the necked portion within the main chamber by manipulating the retaining wire wind-up mechanism and the guide pipes. Therefore, re-melting operation can be performed easily and rapidly.

What is claimed is:

1. An apparatus for pulling up a single crystal, which is installed in an apparatus of manufacturing semiconductor single crystal by the CZ method comprising:

multiple pairs of guide pipes which are capable of being moved upward or downward with respect to a seed holder suspended at the lower end of a lifting wire;

a plurality of retaining wires, each retaining wire passing through one pair of the guide pipes and having its central portion to be bent into a "U" shape or a ring shape; and means for winding up the retaining wires.

2. The apparatus for pulling up a single crystal as claimed in claim 1, wherein the retaining wires are made of Tungsten.

3. The apparatus for pulling up a single crystal as claimed in claim 1, wherein the retaining wires are made of Molybdenum.

4. The apparatus for pulling up a single crystal as claimed in claim 1, wherein the retaining wires are made of Carbon.

5. The apparatus for pulling up a single crystal as claimed in claim 1, wherein weight sensors are respectively provided on the means for winding up the lifting wires and the retaining wires.

6. The apparatus for pulling up a single crystal as claimed in claim 1, wherein each of the multiple pairs of the guide pipes can be independently driven to move upward or downward.

* * * * *